(12) United States Patent
Kubo et al.

(10) Patent No.: US 7,320,916 B2
(45) Date of Patent: Jan. 22, 2008

(54) MANUFACTURING METHOD OF SEMICONDUCTOR DEVICE

(75) Inventors: Hirotoshi Kubo, Gunma (JP); Yasuhiro Igarashi, Kumagaya (JP); Masahiro Shibuya, Gifu (JP)

(73) Assignees: Sanyo Electric Co., Ltd., Osaka (JP); Gifu Sanyo Electronics Co., Ltd., Gifu (JP)

( * ) Notice: Subject to any disclaimer, the term of this patent is extended or adjusted under 35 U.S.C. 154(b) by 0 days.

(21) Appl. No.: 10/952,381

(22) Filed: Sep. 29, 2004

(65) Prior Publication Data

US 2005/0106843 A1    May 19, 2005

(30) Foreign Application Priority Data

Nov. 10, 2003    (JP) ............................. 2003-380308
Jul. 30, 2004    (JP) ............................. 2004-223228

(51) Int. Cl.
*H01L 21/336*    (2006.01)
(52) U.S. Cl. .................... 438/268; 257/E21.42
(58) Field of Classification Search .......... 438/197, 438/199, 213, 220, 223–224, 227–228, 275–276, 438/279, 289–291, 268, 473–474, 476, 480, 438/531–515
See application file for complete search history.

(56) References Cited

U.S. PATENT DOCUMENTS

| | | | | |
|---|---|---|---|---|
| 4,455,740 A | * | 6/1984 | Iwai | 438/270 |
| 4,904,613 A | * | 2/1990 | Coe et al. | 438/268 |
| 5,173,446 A | * | 12/1992 | Asakawa et al. | 438/412 |
| 5,734,185 A | * | 3/1998 | Iguchi et al. | 257/336 |
| 5,933,719 A | * | 8/1999 | Nii et al. | 438/202 |
| 6,287,906 B1 | * | 9/2001 | Yamashita et al. | 438/199 |

FOREIGN PATENT DOCUMENTS

| | | | |
|---|---|---|---|
| JP | 60-138916 | | 7/1985 |
| JP | 60138916 A | * | 7/1985 |
| JP | 2003-151917 A | | 5/2003 |

OTHER PUBLICATIONS

Chinese Office Action dated Jun. 11, 2007, directed to counterpart CN application No. 200410012007.

* cited by examiner

*Primary Examiner*—Michael Lebentritt
*Assistant Examiner*—Andre' Stevenson
(74) *Attorney, Agent, or Firm*—Morrison & Foerster LLP

(57) ABSTRACT

When Ti as a barrier metal layer is brought into contact with a diffusion region of boron provided on a surface of a silicon substrate, there is a problem that boron is absorbed by titanium silicide, and contact resistance is increased. Although there is a method of additionally implanting boron whose amount is equal to the amount of boron absorbed by titanium silicide, there has been a problem that when boron is additionally implanted into, for example, a source region in a p-channel type, the additionally added boron is diffused deeply at the diffusion step, and characteristics are deteriorated. According to the invention, after formation of an element region, boron is additionally implanted into the whole surface at a dosage of about 10% of an element region, and is activated in the vicinity of a surface of a silicon substrate by an alloying process of a barrier metal layer. By this, a specified concentration profile of the element region is kept, and the impurity concentration only in the vicinity of the surface can be raised. Accordingly, even if boron is absorbed by titanium silicide, a specified boron concentration can be kept in the element region, and the increase of contact resistance can be suppressed.

8 Claims, 10 Drawing Sheets

Prior Art

FIG.16

Prior Art

FIG.17

Prior Art

FIG.18A

Prior Art

FIG.18B

Prior Art

FIG.18C

Prior Art

MANUFACTURING METHOD OF SEMICONDUCTOR DEVICE

BACKGROUND OF THE INVENTION

1. Field of the Invention

The present invention relates to a manufacturing method of a semiconductor device, and particularly to a manufacturing method of a semiconductor device in which the increase of contact resistance due to the absorption of boron by titanium is suppressed and the characteristics are improved.

2. Description of the Related Art

As the miniaturization of a semiconductor device advances, in the semiconductor device with a silicon substrate, a barrier metal layer made of titanium-based metal (for example, Ti, TiN, TiON, TiW, etc.) is formed before the formation of a wiring layer.

Figure 15:
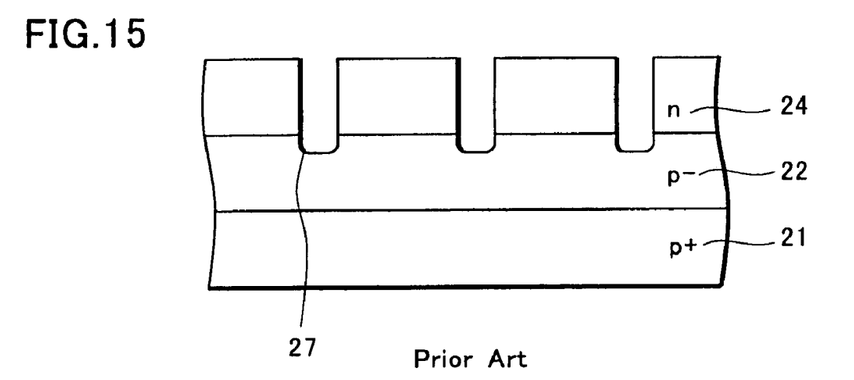
FIG. 15 is a sectional view for explaining a conventional manufacturing method of a semiconductor device.
Figure 16:
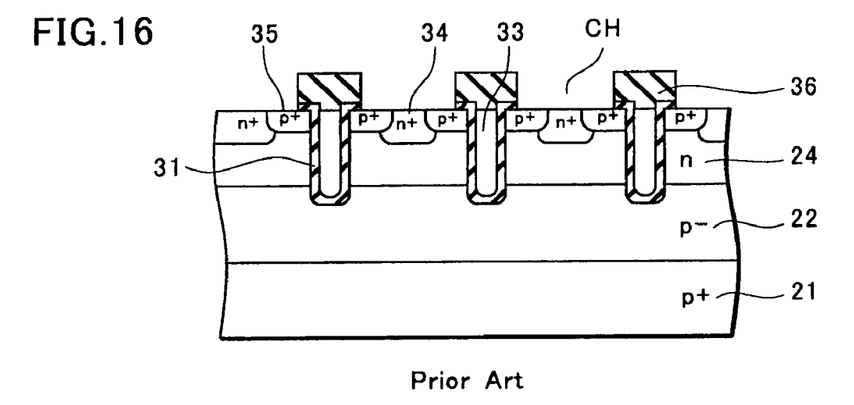
FIG. 16 is a sectional view for explaining the conventional manufacturing method of the semiconductor device.
Figure 17:
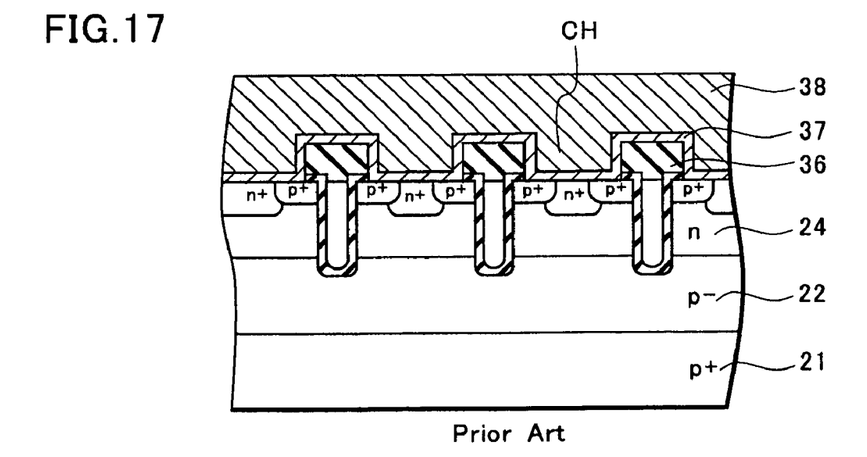
FIG. 17 is a sectional view for explaining the conventional manufacturing method of the semiconductor device.

With reference to FIGS. 15 to 17, a conventional manufacturing method of a semiconductor device will be described while a power MOSFET with a trench structure is used as an example.

In FIG. 15, a p$^-$-type epitaxial layer is laminated on a p$^+$-type silicon semiconductor substrate 21 to form a drain region 22. After an oxide film (not shown) is formed on the surface, the oxide film at a portion of a planned channel layer 24 is etched. This oxide film is used as a mask, and boron is implanted into the whole surface at a dosage of $1.0 \times 10^{13}$ cm$^{-2}$, and then, boron is diffused to form the n-type channel layer 24.

Next, trenches are formed. A mask of a CVD oxide film of NSG (Non-doped Silicate Glass) is provided on the whole surface, the silicon semiconductor substrate is dry-etched by CF-based and HBr-based gas, and the trenches 27 are formed to pass through the channel layer 24 and to reach the drain region 22.

In FIG. 16, first, dummy oxidation is performed to form a dummy oxide film on inner walls of the trenches 27 and the surface of the channel layer 24 and to remove etching damage at the time of dry etching. The dummy oxide film formed by this dummy oxidation and the CVD oxide film are simultaneously removed by oxide film etchant such as hydrofluoric acid, so that a stable gate oxide film can be formed. Besides, thermal oxidation is performed at high temperature to round an opening part of the trench 27, and there is obtained an effect to avoid electric field concentration at the opening part of the trench 27. Thereafter, a gate oxide film 31 is formed. That is, the whole surface is subjected to thermal oxidation, and the gate oxide film 31 is formed to have a thickness of, for example, several hundred Å according to a threshold.

Thereafter, a non-doped polysilicon layer is deposited on the whole surface, boron is implanted and diffused at a high concentration to raise the conductivity, and the polysilicon layer deposited on the whole surface is dry-etched without a mask so that gate electrodes 33 embedded in the trenches 27 remain.

Besides, body regions 34 for stabilizing the potential of the substrate and source regions 35 will be formed. First, n$^+$-type impurities such as As$^+$ are selectively ion-implanted while using a resist film as a mask, and then, the resist film is removed. Further, masking is performed by a new resist film so that the planned source regions 35 and the gate electrodes 33 are exposed, p$^+$-type impurities such as boron are ion-implanted, and the resist film is removed.

Thereafter, an insulating film of BPSG (Boron Phosphorus Silicate Glass) or the like which becomes an interlayer insulating film and a multilayer film are deposited on the whole surface by using a technique such as a CVD method, and the implanted n$^+$-type impurities and the p$^+$-type impurities are diffused in the surface of the channel layer 24, so that the p$^+$-type source regions 35 adjacent to the trenches 27 and the n$^+$-type body region 34 between the source regions 35 are formed.

Further, a resist film is used as a mask and the interlayer insulating film is etched, so that an interlayer insulating film 36 is made to remain on at least the gate electrode 33, and a contact hole CH to a metal wiring layer 38 is formed. By this, an element region of the MOSFET is formed.

In FIG. 17, first, a high melting point metal layer 37 which becomes a barrier metal layer is formed of titanium-based material (for example, Ti/TiN, etc.), and subsequently thereto, aluminum alloy which becomes the metal wiring layer 38 is sputtered on the whole surface (see, for example, Japanese Laid Open Patent Publication No. 2003-151917).

As a metal wiring layer of a semiconductor device with a silicon substrate, aluminum-based metal material such as aluminum alloy as described above is generally used. In this case, silicon is mixed in the aluminum alloy.

However, at present, the miniaturization of elements advances, and each region is formed to be more minute. Thus, there have been problems that grains (silicon nodules) of silicon mixed in aluminum to suppress spike (mutual diffusion of aluminum and silicon) block up the source region or the body region exposed in the contact hole CH, and poor contact occurs or the substrate potential becomes unstable.

Thus, a barrier metal layer made of titanium-based metal (for example, Ti, TiN, TiON, TiW, etc.) is formed before the formation of the Al wiring layer to suppress the growth of the Si nodules in the contact hole and to prevent the mutual diffusion in the contact portion between the Al wiring layer and the semiconductor substrate surface.

Here, the element region is composed by a p-type impurity diffusion region and an n-type impurity diffusion region, and boron (B+) is generally adopted as a p-type impurity. In the element region, as described above, the metal layer including at least Ti in the undermost layer is formed as the barrier metal layer. That is, a titanium silicide layer is formed by chemical reaction of a silicon layer in which the p-type impurity is diffused and titanium.

However, there has been a problem that at the time of this reaction, boron atoms in the element region formed in the silicon substrate are absorbed by the titanium silicide layer and the surface concentration of the p-type impurity diffusion region is lowered.

For example, as described above, in the p-channel MOSFET, the source region is the region formed by diffusing boron, and when boron is absorbed by titanium silicide and the surface concentration of the source region is lowered, the contact resistance to the wiring layer as the source electrode is increased, and the element characteristics are deteriorated.

On the other hand, although not shown, in an n-channel MOSFET, boron is adopted in a p$^+$-type body region between source regions. Since a barrier metal layer is in contact with the body region as well, boron atoms in the body region are absorbed by a titanium silicide layer.

As stated above, when the surface concentration of the body region is lowered, the substrate potential can easily become unstable, and there is a problem that deterioration of avalanche resistance is caused.

Then, a method is adopted in which boron is additionally implanted to compensate the absorbed boron and to prevent the lowering of the surface concentration of the p⁺-type region.

Figure 18A:
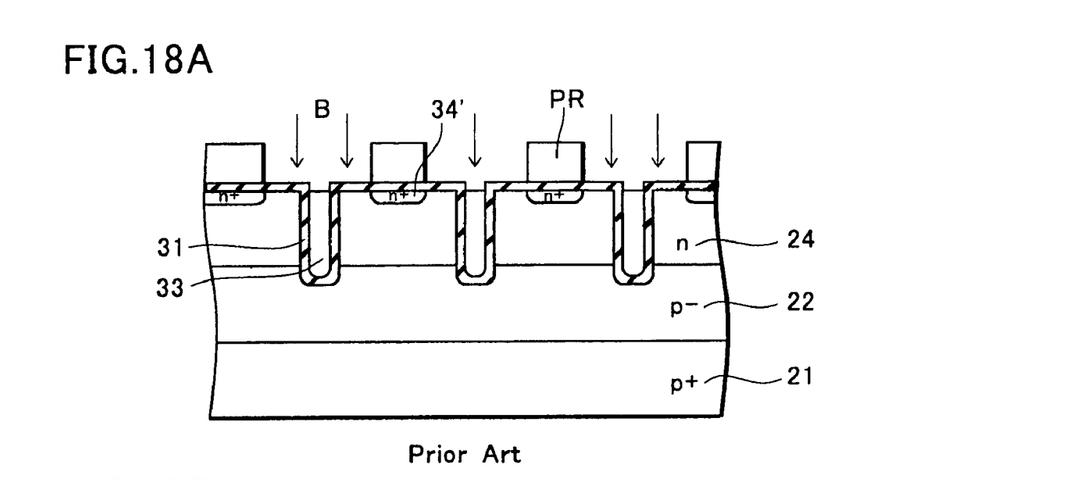
FIGS. 18A to 18C are sectional views for explaining a manufacturing method of a semiconductor device in which additional implantation of boron is performed.
Figure 18B:
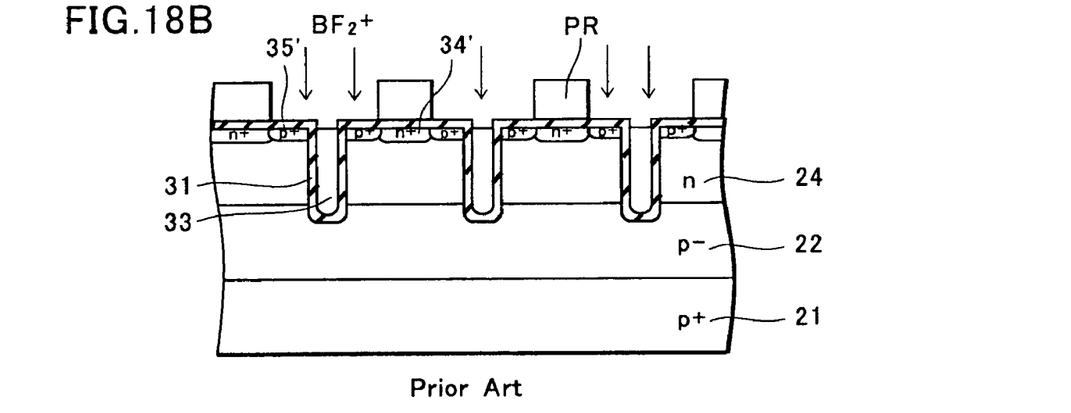
Figure 18C:
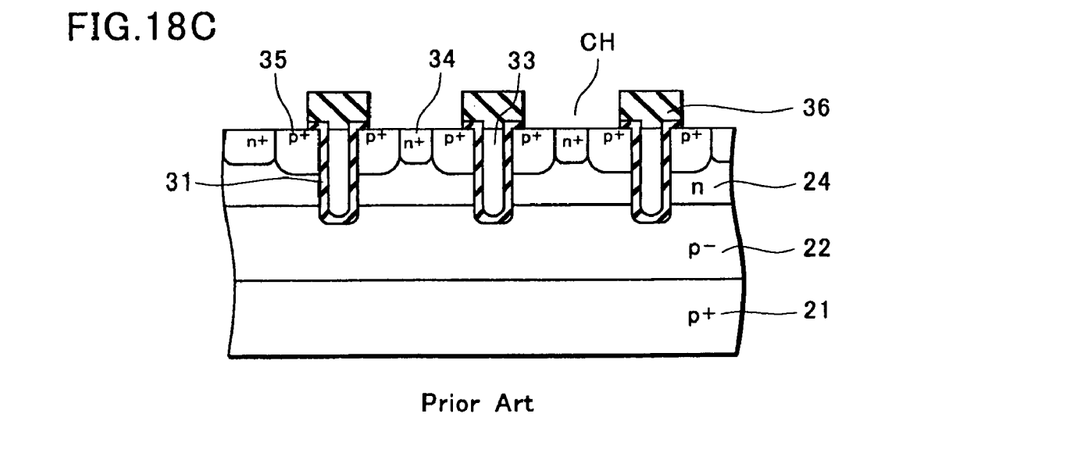

For example, FIGS. 18A to 18C show a step of additionally implanting boron. These are sectional views of a case in which in the step of forming the source region shown in FIG. 16, boron is additionally implanted.

First, n-type impurities, which form the body regions, are ion-implanted to form n⁺-type impurity regions 34', and then, a mask of a resist film PR is formed, boron forming the source regions is ion-implanted into planned regions of source region formation at an implantation energy of 50 KeV and a dosage of $5 \times 10^{15}$ cm⁻², and p⁺-type impurity regions 35' are formed (FIG. 18A).

Subsequently, boron is additionally implanted in consideration of the amount of absorption. That is, boron fluoride ion ($BF_2^+$) is ion-implanted at an implantation energy of 100 KeV and a dosage of $5 \times 10^{15}$ cm⁻². Here, the impurity to be the source region and the additionally implanted impurity are implanted through the gate insulating film 31. In the above case, boron fluoride having a large mass number is adopted in order to make the impurity ion stay in the vicinity of the surface. Thus, in the ion implantation of boron fluoride, an implantation energy of about 100 KeV is required so that the ion passes through the gate oxide film 31 and reaches the Si substrate (FIG. 18B).

Thereafter, an insulating film of BPSG (Boron Phosphorus Silicate Glass) or the like and a multilayer film which become interlayer insulating films are deposited on the whole surface by a CVD method, and the n⁺-type impurity regions 34' and the p⁺-type impurity regions 35', and the additionally implanted boron are diffused, so that the body regions 34 and the source regions 35 are formed.

Further, the contact hole CH in which the metal wiring layer is in contact with the source region 35 and the body region 34 is formed and reflow is performed.

That is, in this step, after the additional implantation of boron, a heat treatment (1000° C. or lower, about 60 minutes) at the time of film formation of the interlayer insulating film, and a heat treatment (1000° C. or lower, about 30 minutes) after the formation of the contact hole CH, that is, the two heat treatment steps are performed. Thus, the source region 35 enters more deeply than the specified depth of the source region 35 in the direction toward the bottom of the trench 27 (FIG. 18C).

As stated above, when the source region 35 is extended, the channel region formed along the trench 27 becomes short, and there has been a problem that the increase of IDSS leak and the deterioration of VDSS are caused by the short channel effect.

In the case of an n-channel type, at the time of ion implantation of the formation of the body region 34, additional implantation of boron is performed. The condition is similar to the case of the p-channel source region 35. However, also in this case, it has been found that since the reflow after the film formation of the BPSG film and the formation of the contact hole CH is performed, the ions are deeply diffused by the two heat treatment steps, the surface concentration of the body region 34 is not much increased, and boron is absorbed by titanium silicide, so that the surface concentration of the body region 34 is lowered.

SUMMARY OF THE INVENTION

The present invention has been made in view of the problems as described above, and according to a first aspect of the invention, a manufacturing method of a semiconductor device includes a step of forming an element region made up of a p-type impurity diffusion region and an n-type impurity diffusion region on a surface of a semiconductor substrate, and a step of forming a high melting point metal layer which is in contact with at least the p-type impurity diffusion region through a contact hole, in which after the element region is formed, a p-type impurity is implanted into the contact hole, and the high melting point metal layer is formed.

According to a second aspect of the invention, a manufacturing method of a semiconductor device includes a step of forming a drain region, a gate electrode, a source region, and a body region on a semiconductor substrate to form an element region, a step of forming an interlayer insulating film having a contact hole to a metal wiring layer on the element region, a step of implanting a p-type impurity into the contact hole, a step of forming a high melting point metal layer which is in contact with at least the source region and the body region through the contact hole, and a step of forming a metal wiring layer on the high melting point metal layer.

According to a third aspect of the invention, a manufacturing method of a semiconductor device includes a step of forming a p-type drain region on a semiconductor substrate, a step of forming an n-type channel layer on a surface of the drain region, a step of forming a gate electrode which is in contact with the channel layer through an insulating film, a step of forming a p-type source region and an n-type body region on a surface of the channel layer to form an element region, a step of forming an interlayer insulating film having a contact hole to a metal wiring layer on the element region, a step of implanting a p-type impurity into the contact hole, a step of forming a high melting point metal layer which is in contact with the source region and the body region through the contact hole, and a step of forming the metal wiring layer on the high melting point metal layer.

According to a fourth aspect of the invention, a manufacturing method of a semiconductor device includes a step of forming an n-type drain region on a semiconductor substrate, a step of forming a p-type channel layer on a surface of the drain region, a step of forming a gate electrode which is in contact with the channel layer through an insulating film, a step of forming an n-type source region and a p-type body region on a surface of the channel layer to form an element region, a step of forming an interlayer insulating film having a contact hole to a metal wiring layer on the element region, a step of implanting a p-type impurity into the contact hole, a step of forming a high melting point metal layer which is in contact with the body region and the source region through the contact hole, and a step of forming the metal wiring layer on the high melting point metal layer.

The high melting point metal layer includes titanium.

The p-type impurity is boron.

The p-type impurity is implanted at a dosage of about 1/10 of an impurity of the source region.

The p-type impurity is implanted at a dosage of about 1/10 of an impurity of the body region.

The p-type impurity is ion-implanted so that a peak of a concentration profile of the p-type impurity is positioned in a shallow region within about 1000 Å from a surface of the substrate.

The p-type impurity is implanted at a dosage of about $4 \times 10^{14}$ cm⁻² to $1 \times 10^{15}$ cm⁻².

In this embodiment, after the element region is formed, boron whose amount is equal to the amount of boron absorbed by titanium silicide is additionally ion-implanted and diffused. Thereafter, titanium silicide is formed.

At this time, the additional ion implantation is performed after the film formation of the interlayer insulating film and the formation of the contact hole CH, and the additionally implanted boron is diffused by the reflow of the contact hole CH. Thereafter, since the high melting point metal layer 17 is subsequently formed, the amount of heat treatment to which the additionally implanted boron is subjected after the diffusion is small, and the progress of the diffusion can be suppressed. Accordingly, even if boron is absorbed by titanium silicide, the impurity concentration of boron in the vicinity of the surface of the substrate can be kept, and the variation of the concentration profile of the element region can be suppressed.

Besides, boron can be implanted in the state where the source region 15 and the body region 14 are exposed. That is, since the additional ion implantation is performed in the state where the gate oxide film is removed, even in the implantation to the shallow region, the control of implantation energy is easy, and ions can be made to stay in the vicinity of the surface of the substrate.

Further, since the additional ion implantation can be performed to the whole surface without providing a mask, there is a merit that the method can be performed without increasing the number of masks.

By this, for example, in the p-channel MOSFET, the impurity concentration in the vicinity of the surface of the source region is increased, and the source region can keep the shallow profile. By this, the IDSS leak and the deterioration of VDSS due to the short channel effect are not caused, and the reduction of the contact resistance can be realized.

On the other hand, in the case of the n-channel MOSFET, the impurity concentration in the vicinity of the surface of the body region can be increased. Besides, since the additionally implanted boron is activated in the vicinity of the surface and is not diffused deeply, the surface concentration of the body region can be kept.

Thus, even if boron is absorbed by titanium silicide, the surface concentration of the body region is not lowered, the deterioration of the avalanche resistance is prevented, and the increase of the contact resistance is prevented.

DETAILED DESCRIPTION OF THE INVENTION

Embodiments of the present invention will be described in detail with reference to FIGS. 1 to 14.

First, a first embodiment of the invention will be described with reference to FIGS. 1 to 8 while a MOSFET of a p-channel trench structure is used as an example.

Figure 1:
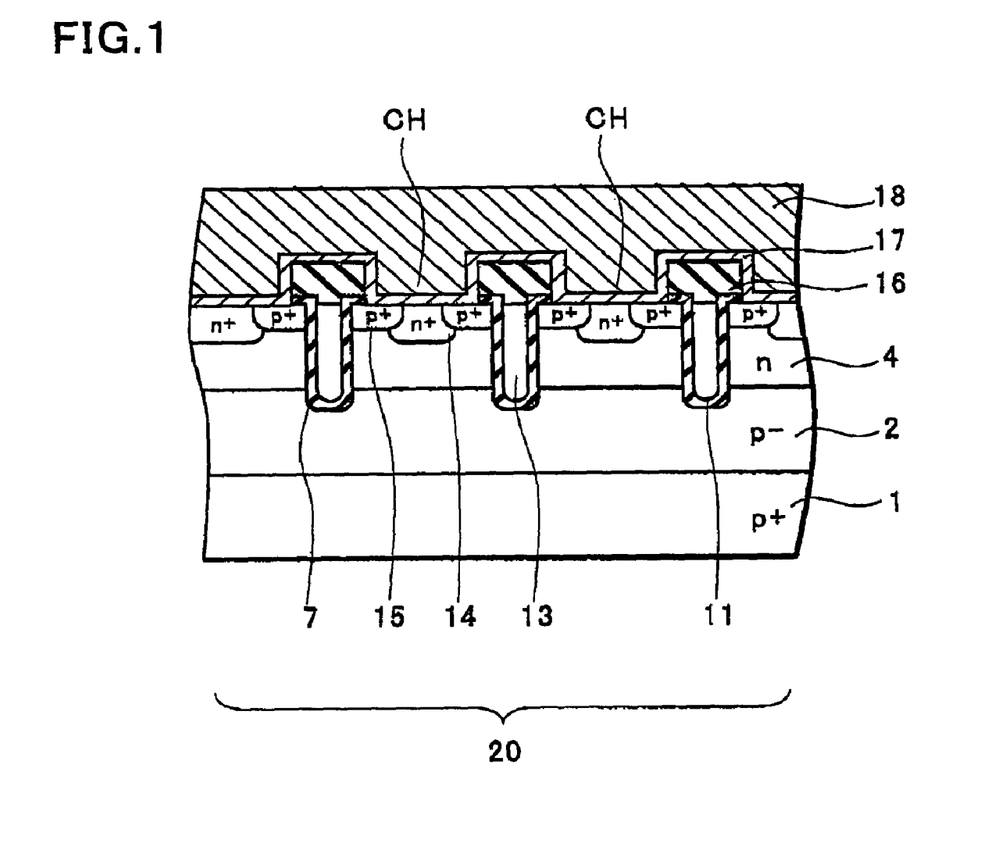
FIG. 1 is a sectional view for explaining a semiconductor device of the invention.

FIG. 1 shows a structure of the trench type MOSFET of the invention. A drain region 2 made of a p$^-$-type epitaxial layer is provided on a p$^+$-type silicon semiconductor substrate 1, and an n-type channel layer 4 is provided on its surface.

Trenches 7 are provided to pass through the channel layer 4 and to reach the drain region 2, an inner wall of each of the trenches 7 is coated with a gate oxide film 11, and a gate electrode 13 made of polysilicon filled in the trench 7 is provided.

P$^+$-type source regions 15 are provided on the surface of the channel layer 4 adjacent to the trench 7, and an n$^+$-type body region 14 is disposed on the surface of the channel layer 4 between the source regions 15 of adjacent two the trenches 7. Further, at the time of applying gate voltage to the gate electrode 13, a channel region (not shown) is formed along the trench 7 from the source region 15 to the drain region 2. An upper part of the gate electrode 13 is covered with an interlayer insulating film 16. A part between the interlayer insulating films 16 becomes a contact hole CH to a metal wiring layer 18. A high melting point metal layer 17, which becomes a barrier metal layer, is in contact with the exposed source region 15 and the body region 14, and the metal wiring layer 18 made of aluminum alloy or the like is provided on the high melting point metal layer 17.

FIGS. 2A to 6 show a manufacturing method of the MOSFET. The manufacturing method of the trench type power MOSFET of the invention includes a step of forming a drain region, a gate electrode, a source region and a body region on a semiconductor substrate to form an element region, a step of forming an interlayer insulating film having a contact hole to a metal wiring layer on the element region, a step of implanting a p-type impurity into the contact hole, a step of forming a high melting point metal layer which is in contact with the source region and the body region through the contact hole, and a step of forming the metal wiring layer on the high melting point metal layer.

First step (see FIGS. 2A to 2C, FIGS. 3A to 3C): a step of forming a drain region, a gate electrode, a source region and a body region on a semiconductor substrate to form an element region, and of forming an interlayer insulating film having a contact hole to a metal wiring layer on the element region.

Figure 2A:
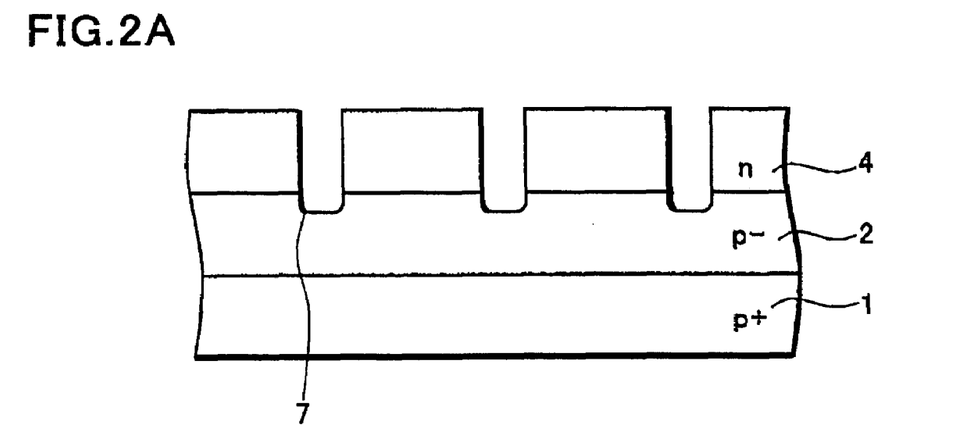
FIGS. 2A to 2C are sectional views for explaining a manufacturing method of a semiconductor device of the invention.

First, a drain region 2 is formed on a p$^+$-type silicon semiconductor substrate 1 by laminating a p$^-$-type epitaxial layer. After an oxide film (not shown) is formed on the surface, the oxide film of a portion of a planned channel layer is etched. This oxide film is used as a mask, and for example, phosphorus (P) is implanted into the whole surface at a dosage of $1.0 \times 10^{13}$ cm$^{-2}$, and then is diffused to form the n-type channel layer 4.

Next, trenches are formed. A CVD oxide film (not shown) of NSG (Non-doped Silicate Glass) is formed on the whole surface by a CVD method, a mask made of a resist film is put on the film except portions which become trench opening parts, the CVD oxide film is dry-etched to be partially removed, and the trench opening parts in which the channel region 4 is exposed are formed.

Further, the CVD oxide film is used as the mask, the silicon semiconductor substrate of the trench opening parts is dry-etched by CF-based and HBr-based gas, and trenches 7 are formed to pass through the channel layer 4 and to reach the drain region 2 (FIG. 2A).

Figure 2B:
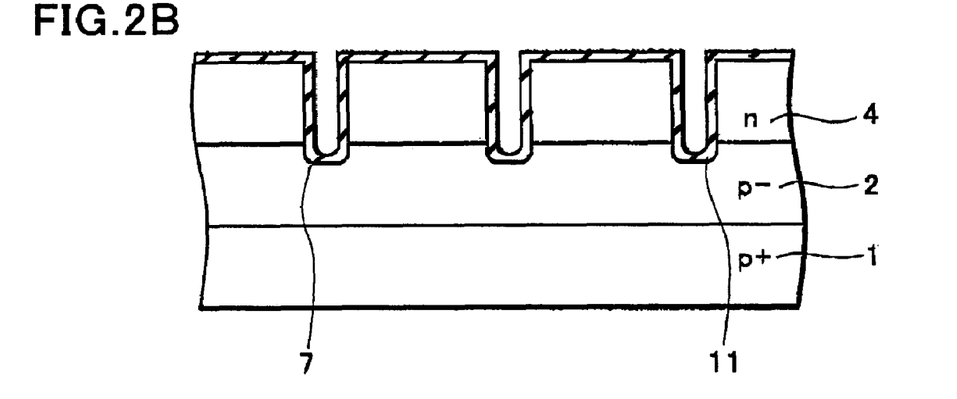

Next, dummy oxidation is performed to form a dummy oxide film (not shown) on inner walls of the trenches 7 and a surface of the channel layer 4 and to remove etching damage at the dry etching. The dummy oxide film formed by the dummy oxidation and the CVD oxide film which has become a mask are simultaneously removed by oxide film etchant such as hydrofluoric acid, so that a stable gate oxide film can be formed. Besides, the thermal oxidation is performed at high temperature, so that the opening part of the trench 7 is rounded, and there is an effect to avoid electric field concentration at the opening part of the trench 7. Thereafter, a gate oxide film 11 is formed. That is, the whole surface is subjected to thermal oxidation, and the gate oxide film 11 is formed to have a thickness of, for example, several hundred Å according to a threshold (FIG. 2B).

Figure 2C:
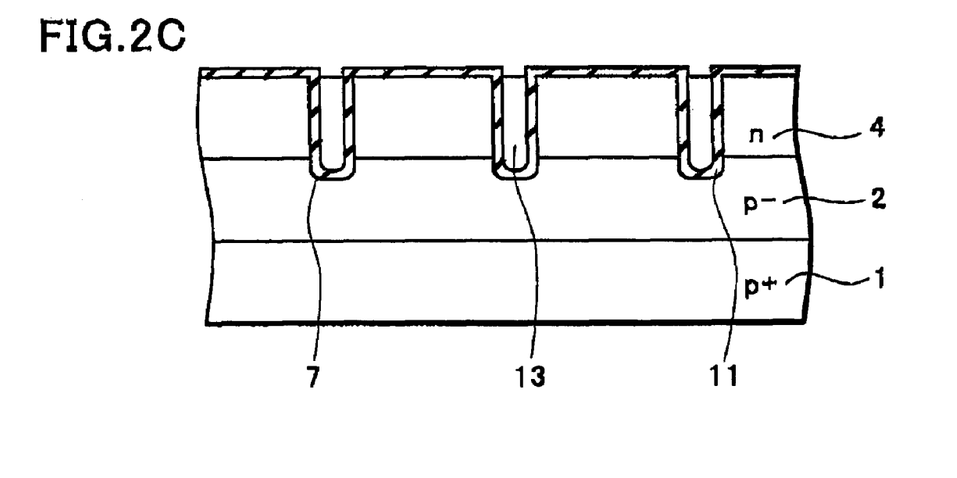

Further, a non-doped polysilicon layer is deposited on the whole surface, for example, boron is implanted and diffused at a high concentration to obtain high conductivity, and the polysilicon layer deposited on the whole surface is dry-etched without a mask to form a gate electrodes 13 embedded in the trench 7 (FIG. 2C).

Figure 3A:
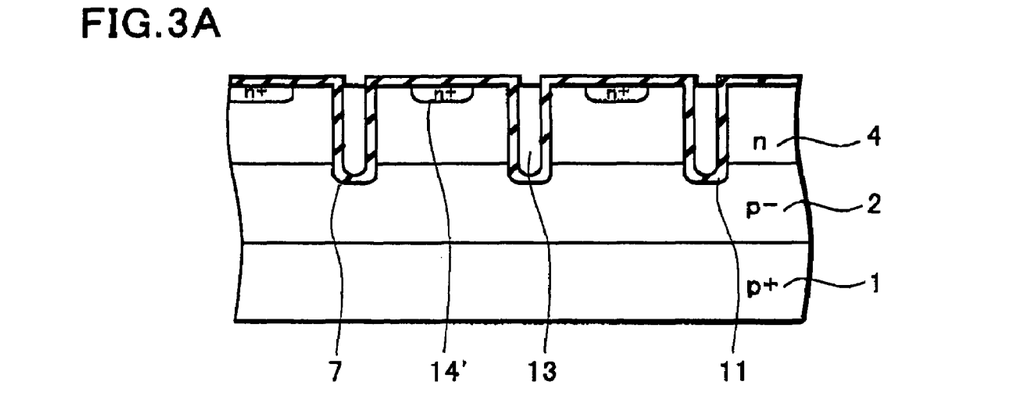
FIGS. 3A to 3C are sectional views for explaining the manufacturing method of the semiconductor device of the invention.
Figure 3B:
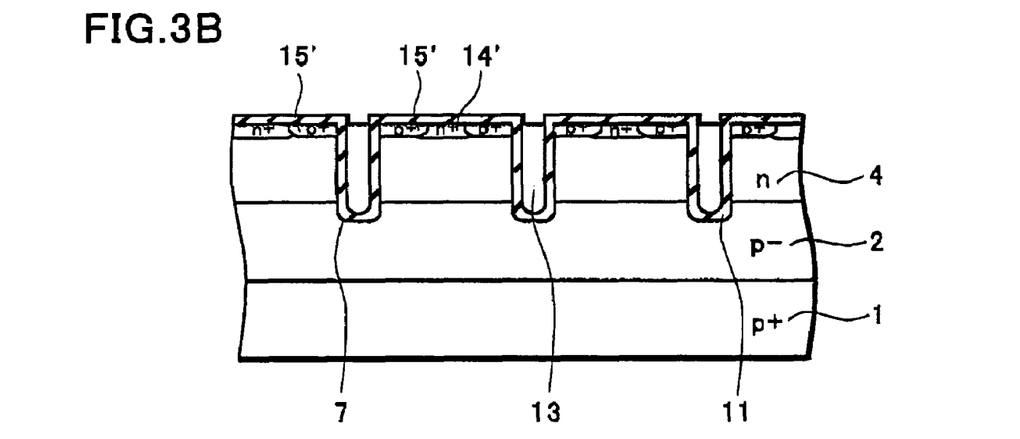
Figure 3C:
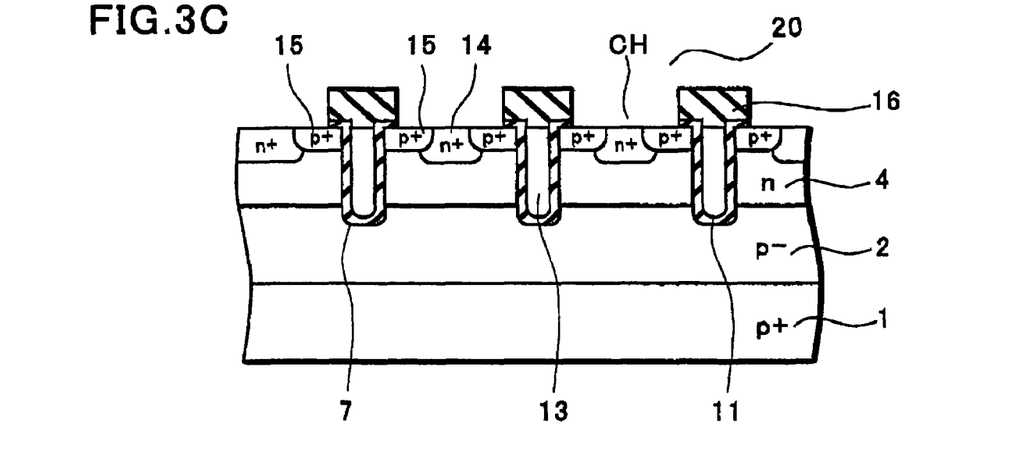

Thereafter, as shown in FIGS. 3A to 3C, body regions 14 for stabilizing the potential of the substrate and source regions 15 are formed. That is, n-type impurities such as arsenic (As$^+$) are selectively ion-implanted with a mask of a resist film at a dosage of about $1 \times 10^{15}$ cm$^{-2}$ to form n$^+$-type impurity regions 14', and then, the resist film is removed (FIG. 3A).

Further, masking is performed by a new resist film so that planned source regions and the gate electrodes 13 are exposed, and boron is ion-implanted at an implantation energy of 50 KeV and a dosage of about $5 \times 10^{15}$ cm$^{-2}$ to form p$^+$-type impurity regions 15' (FIG. 3B).

Thereafter, an insulating film of BPSG (Boron Phosphorus Silicate Glass) or the like and a multilayer film which become interlayer insulating films are deposited on the whole surface by the CVD method. The n$^+$-type impurity regions 14' and the p$^+$-type impurity regions 15' are diffused by the heat treatment (1000° C. or lower, about 60 minutes) at the time of the film formation to form the source regions 15 of the surface of the channel layer 4 adjacent to the trench 7 and the body region 14 positioned between the source regions 15. By this, an element region 20 is formed.

In this embodiment, although the p$^+$-type impurity regions 15' are formed after the n$^+$-type impurity regions 14' are formed, the n$^+$-type impurity regions 14' may be formed after the p$^+$-type impurity regions 15' are formed.

Thereafter, a resist film is used as a mask, and the interlayer insulating film is etched, so that an interlayer insulating film 16 remains on at least the gate electrode 13, and a contact hole CH in which the source region 15 and the body region 14 are exposed is formed. The source region 15 and the body region 14 are connected to a metal wiring layer formed at a later step through the contact hole CH (FIG. 3C).

Second step (see FIG. 4): a step of implanting a p-type impurity into the contact hole.

Figure 4:
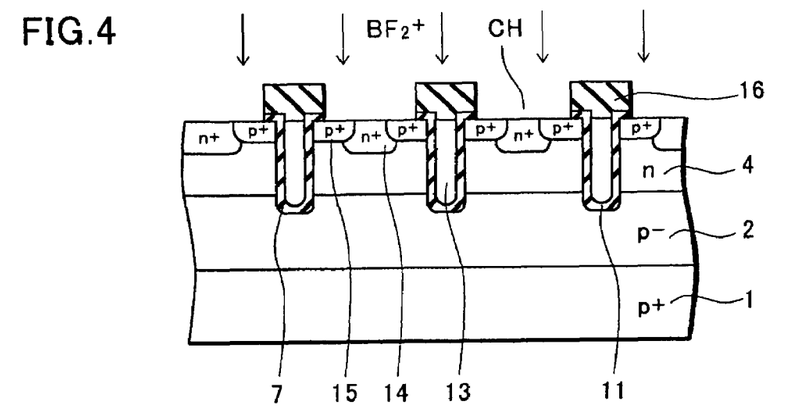
FIG. 4 is a sectional view for explaining the manufacturing method of the semiconductor device of the invention.

For example, boron fluoride ion (BF$_2^+$) is ion-implanted into the whole surface without providing a mask. Since the interlayer insulating film 16 is formed on the gate electrode, boron fluoride is actually ion-implanted into the surfaces of the source region 15 and the body region 14 on which the contact hole CH is formed.

At this time, the dosage of boron fluoride is made about 10% of the boron concentration at the time of formation of the source region 15. Specifically, the dosage is preferably $4 \times 10^{14}$ cm$^{-2}$ to $1 \times 10^{15}$ cm$^{-2}$, and in this embodiment, a dosage of $7 \times 10^{14}$ cm$^{-2}$ is adopted.

With respect to the implantation depth of boron fluoride, the ion implantation is performed under such a condition that the peak of a concentration profile of boron is positioned in a shallow region within about 1000 Å from the surface of the substrate 1 (for example, about 300 Å from the surface of the substrate). Specifically, the implantation energy is made: about 40 KeV.

In this embodiment, at the time of additional ion implantation, the source regions 15 are exposed, and there is no gate oxide film as in the case of FIG. 18B. That is, when the implantation energy is about 40 KeV, implantation can be performed so that the peak of the concentration profile of boron is positioned in the vicinity of the surface of the source region 15 (for example, at a depth of up to about 300 Å from the surface). Conventionally, an implantation energy of about 100 KeV is necessary in order to make the impurity to pass through the gate oxide film. However, in this embodiment, since the implantation energy is low, it is possible to perform the implantation into a specified region stably.

Here, in this embodiment, although boron fluoride is adopted as the impurity of the additional implantation, in addition to this, boron (B) may be used. Since boron has small mass as compared with boron fluoride, in that case, the implantation energy is made about 10 KeV, and boron is made to stay in the vicinity of the surface of the source region 15.

Thereafter, reflow after the formation of the contact hole CH is performed by heat treatment at 1000° C. or lower and for about 30 minutes. Besides, additionally implanted boron is diffused by this reflow.

On the other hand, since a mask is not provided, boron fluoride is implanted and diffused also in the surface of the body region 14. However, in the body region 14, the implantation amount is as high as $1 \times 10^{15}$ cm$^{-2}$, the ion-implanted boron has little influence. Further, even if the total n-type impurity concentration is slightly lowered by the implantation of boron, since the contact resistance of the n-type region has such characteristics that it becomes low in the case where the n-type region is in contact with a titanium-based metal layer as compared with the case where it is in contact with aluminum, there is no problem.

Third step (see FIG. 5): a step of forming a high melting point metal layer which is in contact with at least the source region and the body region through the contact hole.

Figure 5:
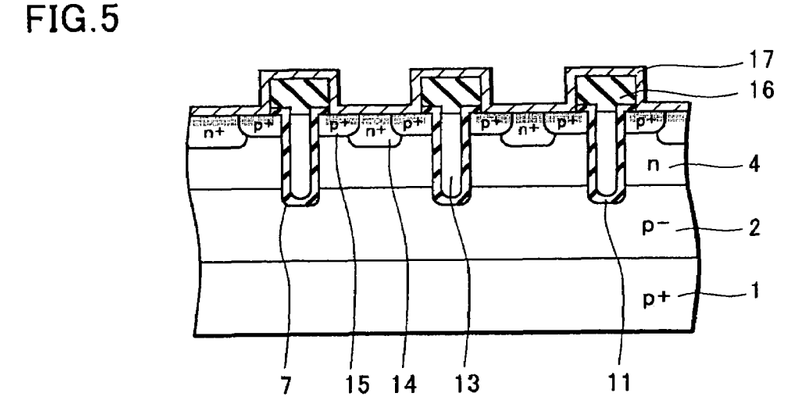
FIG. 5 is a sectional view for explaining the manufacturing method of the semiconductor device of the invention.

The silicon substrate is exposed at portions other than the interlayer insulating film 16. When aluminum alloy which becomes a metal wiring line 18 is sputtered, there is a case where grains (silicon nodules) of silicon contained in aluminum alloy block up the body region 14 or the source region 15 which are minute regions. In order to suppress the silicon nodules and to prevent mutual diffusion, called spike, between the metal and the silicon substrate, a barrier metal layer of titanium-based material is formed before the formation of the metal wiring layer 18.

Titanium is sputtered onto the whole surface, and a lamination film 17 of titanium and titanium nitride having a thickness of about 500 to 1000 Å is formed. The high melting point metal layer 17 is in contact with the source region 15 and the body region 14 exposed in the contact hole CH. Thereafter, the high melting point metal layer 17 is subjected to heat treatment at about 400° C. to 500° C., and a titanium silicide film is formed.

Titanium nitride may be formed by performing RTA (Rapid Thermal Anneal) in a nitrogen atmosphere.

As stated above, in this embodiment, the additionally implanted boron is diffused by the reflow after the formation of the contact hole CH, and then, the high melting point metal layer 17 is subsequently formed. That is, as compared with the case in which the reflow of the contact hole CH is performed after the diffusion of the additionally implanted boron as shown in FIG. 18, the amount of heat treatment after the diffusion of the additionally implanted boron becomes small.

By this, the additionally implanted boron is not diffused more deeply than the source region, and the impurity concentration of the surface of the source region 15 is kept at a high concentration. Accordingly, even if boron is absorbed by the titanium silicide film coming in contact with the source region 15, the specified surface concentration of the source region 15 can be kept.

Fourth step (see FIG. 6): a step of forming the metal wiring layer on the high melting point metal layer.

Figure 6:
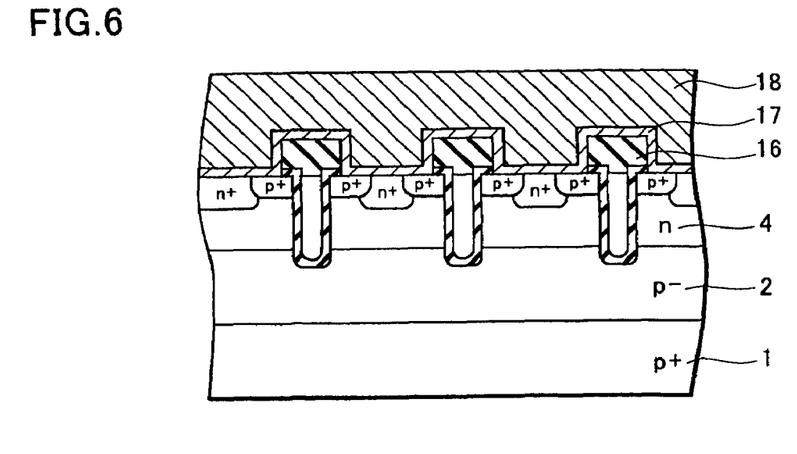
FIG. 6 is a sectional view for explaining the manufacturing method of the semiconductor device of the invention.

For example, aluminum alloy is sputtered onto the whole surface to have a thickness of about 5000 Å. Thereafter, in order to stabilize the metal and the surface of silicon, an alloying heat treatment is performed. This heat treatment is performed at a temperature of 300 to 500° C. (for example, about 400° C.) for 30 minutes in a hydrogen-containing gas, and crystal strain in the metal film is removed to stabilize the interface.

Thereafter, patterning into a specified shape is performed, and the metal wiring layer 18 is formed on the high melting point metal layer 17.

Further, although not shown, SiN or the like which becomes a passivation film is provided. Thereafter, a heat treatment is further performed at 300 to 500° C. (for example. 400° C.) for about 30 minutes in order to remove damage.

Incidentally, diffusion of boron fluoride hardly proceeds by the heat treatment at a temperature of up to about 500° C., and the specified surface concentration can be kept.

Figure 7:
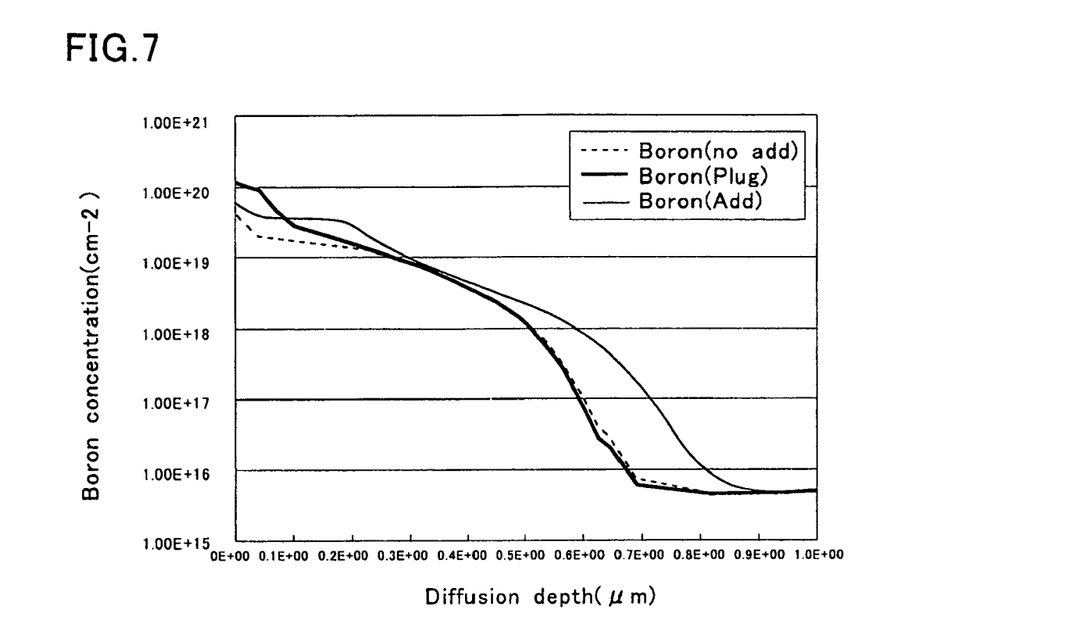
FIG. 7 is a characteristic view for explaining the semiconductor device of the invention.

Here, the concentration profile simulation of the source region is shown in FIG. 7. A broken line indicates a case where like the related art (FIG. 16), additional ion implantation is not performed at the formation of source region 35, and the source region is formed at an implantation energy of 50 KeV and a dosage of $5 \times 10^{15}$ cm$^{-2}$. A solid line indicates a case where as in FIG. 18, after boron of the source region 35 is implanted under the same condition % as the former case, the additional implantation and diffusion of boron is performed at an implantation energy of 100 KeV and a dosage of $5 \times 10^{15}$ cm$^{-2}$, and the reflow after the formation of the contact hole CH is performed. A thick line indicates a case where as in this embodiment, after the source region 15 is formed under the same condition as the former case, the additional boron implantation is performed at an implantation energy of 40 KeV and a dosage of $5 \times 10^{14}$ cm$^{-2}$, and boron is diffused by the reflow of the formation of the contact hole CH. Incidentally, the Y-axis indicates the boron concentration and the X-axis indicates the diffusion depth.

In the graph of FIG. 7, in the additional boron implantation shown in FIG. 18, since there exist the diffusion step of the source region after the additional implantation and the reflow step after the formation of the contact hole, as indicated by the solid line, the source region is extended in the substrate direction.

However, according to this embodiment, the concentration profile in the depth direction is almost coincident with the case (broken line) shown in FIG. 16 in which the source region is singly formed, and the shallow concentration profile can be kept. Further, the impurity concentration can be raised only in the vicinity of the surface of the source region.

Figure 8:
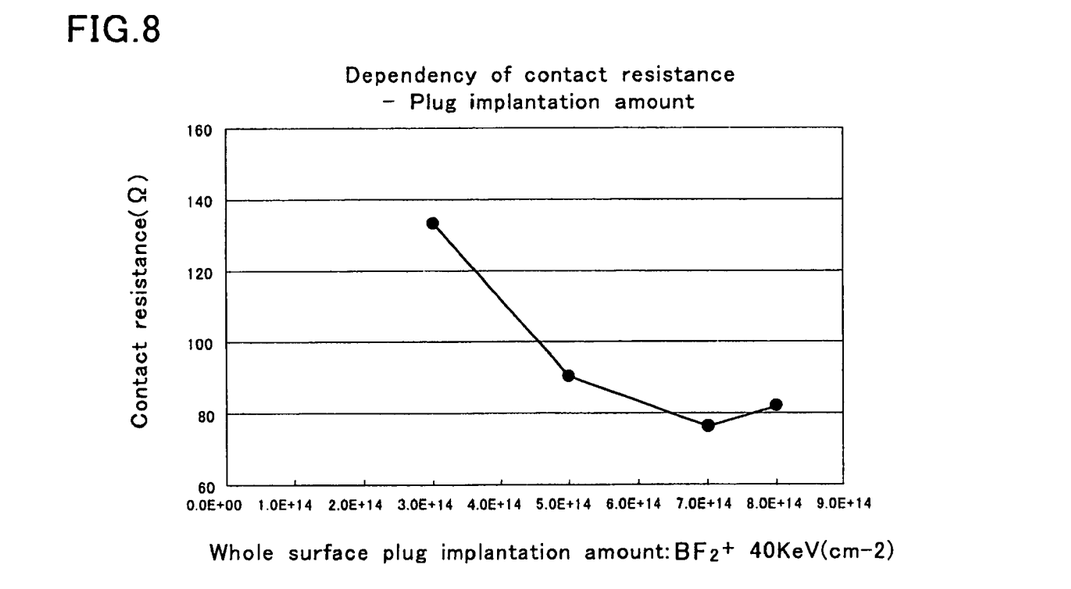
FIG. 8 is a characteristic view for explaining the semiconductor device of the invention.
Figure 9A:
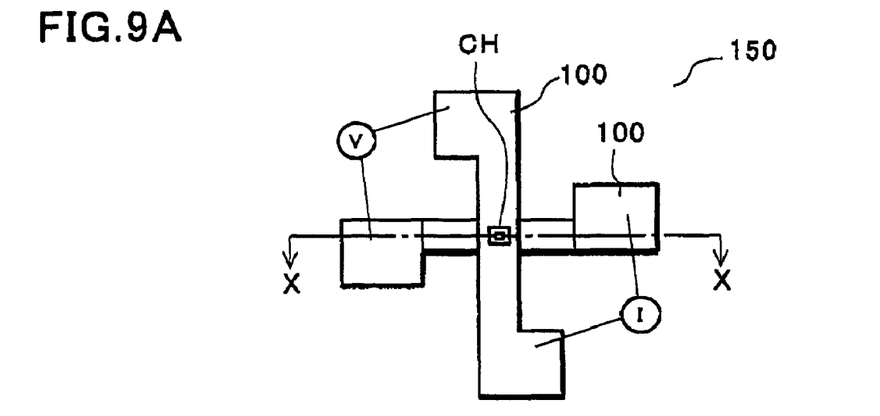
FIGS. 9A and 9B are schematic views for explaining the measuring method of the semiconductor device of the invention.
Figure 9B:
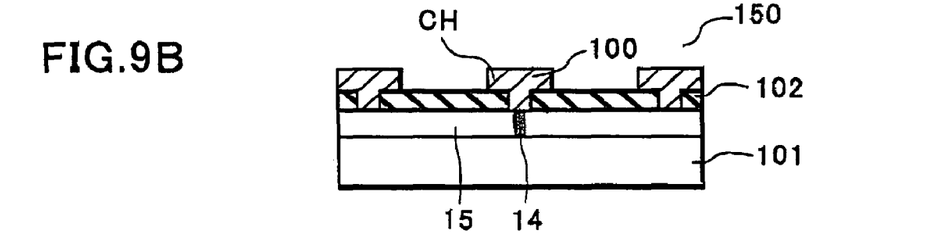

FIG. 8 shows the dependency of the contact resistance value with respect to the amount of additional boron implantation in this embodiment when a TEG (Test Element Group) of FIGS. 9A and 9B is used. This is a graph in which the contact resistance values are measured while changing the amount of additional boron implantation, and the average value is plotted.

As shown in the drawing, in the case where the implantation amount is small (smaller than $4 \times 10^{14}$ cm$^{-2}$), since the added boron can not sufficiently compensate the amount of boron absorbed by titanium silicide, and the surface concentration of the source region 15 can not be kept, and therefore, the contact resistance becomes high.

On the other hand, in the case where the implantation amount is too large ($1 \times 10^{15}$ cm$^{-2}$ or more), since the conductivity of the body region 14 of the n-type region becomes slightly intrinsic, the total sum of the impurity concentration of the surface of the substrate is lowered, and it is estimated that the contact resistance becomes high after all. Especially, the forward characteristic is influenced.

That is, the amount of additional boron implantation according to this embodiment is from $4 \times 10^{14}$ cm$^{-2}$ to $1 \times 10^{15}$ cm$^{-2}$, preferably about $7 \times 10^{14}$ cm$^{-2}$.

When the amount is on this level, it does not have an influence also on the surface concentration of the body region.

FIGS. 9A and 9B are schematic views of a TEG 150 which measures the contact resistance shown in FIG. 8, FIG. 9A is a plan view, and FIG. 9B is a sectional view taken along line X-X of FIG. 9A.

Similarly to the element region 20 of a real device, the TEG 150 of FIG. 9 has such a pattern that the source region 15 (the n-type impurity region having the same concentration as that) is provided on a substrate 101, and the body region 14 (the p-type impurity region having the same concentration as that) is formed at the center part. An electrode 100 for measurement is in contact therewith through a contact hole CH provided in an insulating film 102.

Figure 10A:
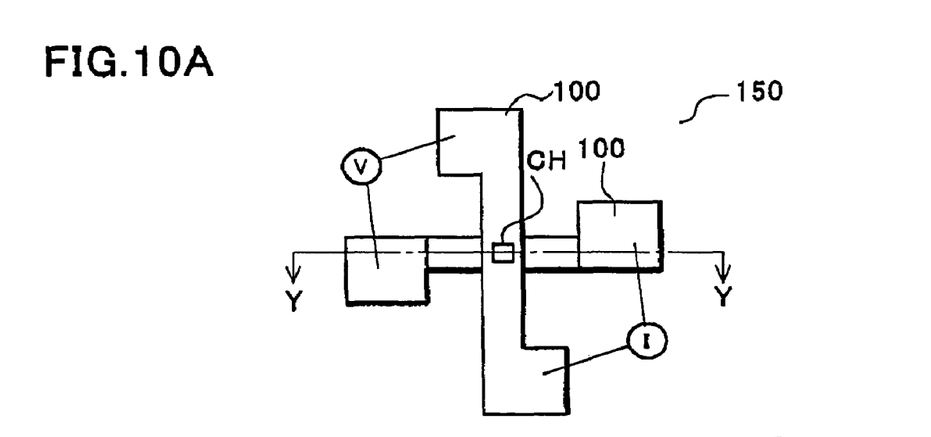
FIGS. 10A and 10B are schematic views for explaining the measuring method of the semiconductor device of the invention.
Figure 10B:
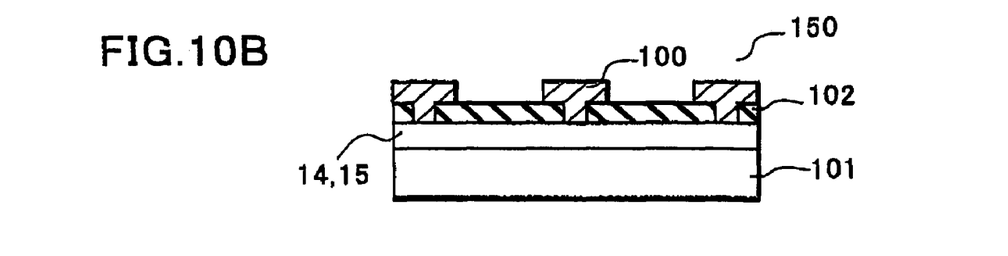

FIGS. 10A and 10B are also schematic views of a TEG 150 similar to FIGS. 9A and 9B, FIG. 10A is a plan view and FIG. 10B is a sectional view taken along line Y-Y of FIG. 10.

The TEG 150 of FIGS. 9A and 9B is the TEG in which the body region 14 and the source region 15 are combined. That is, the body region 14 is diffusion-formed to overlap with a part of the source region 15, and the contact resistance is measured in a state where the impurity of the source region 15 and the impurity of the body region 14 are mixed with each other.

Then, as shown in FIGS. 10A and 10B, the TEG 150 is formed in which the contact resistance is measured only in the source region 15 (the n-type impurity region having the same concentration as that) and only in the body region 14 (the p-type impurity region having the same concentration as that), and the measurement is also performed by this.

Figure 11A:
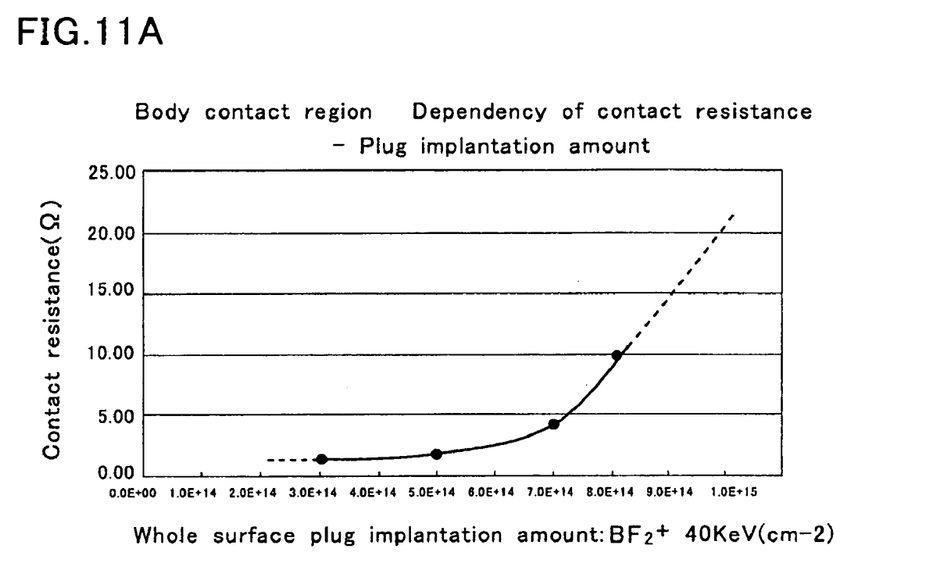
FIGS. 11A and 11B are characteristic views for explaining the semiconductor device of the invention.
Figure 11B:
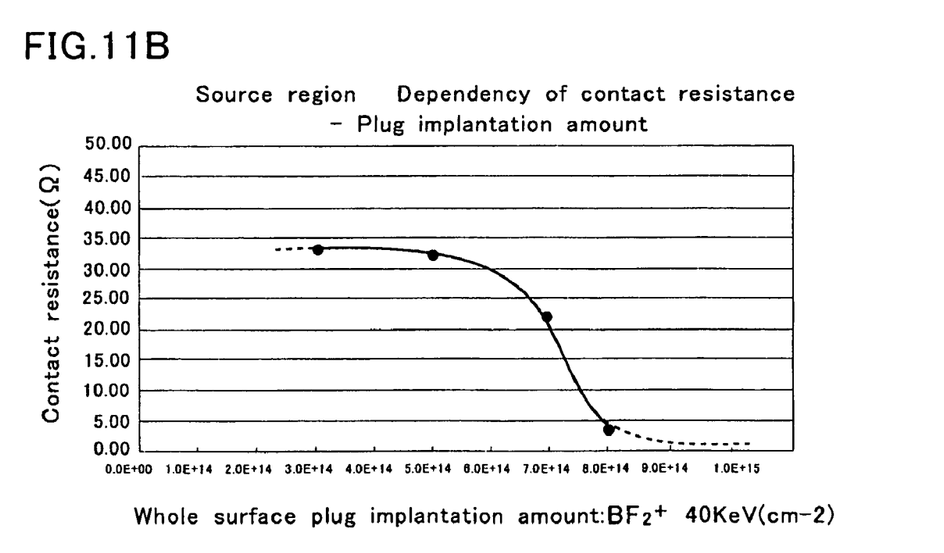

The results are shown in FIGS. 11A and 11B. FIG. 11A shows the relation between the contact resistance of the body region 14 and the boron injection amount, and FIG. 11B shows the relation between the contact resistance of the source region 15 and the boron injection amount. A broken line indicates estimated values by an extrapolation method.

As shown in FIG. 11A, in the body region 14, when the boron implantation amount becomes $7 \times 10^{14}$ cm$^{-2}$ or more, the contact resistance is increased. This indicates that as described before, since the conductivity of the body region 14 of the n-type region becomes slightly intrinsic, the total sum of the impurity concentration of the substrate surface is lowered, and the contact resistance becomes high.

As shown in FIG. 11B, in the source region 15, when the boron implantation amount becomes $7 \times 10^{14}$ cm$^{-2}$ or more, the contact resistance is lowered.

That is, according to FIGS. 11A and 11B, the boron implantation amount is desirably $4 \times 10^{14}$ cm$^{-2}$ to $1 \times 10^{15}$ cm$^{-2}$, and is preferably $7 \times 10^{14}$ cm$^{-2}$.

Figure 12:
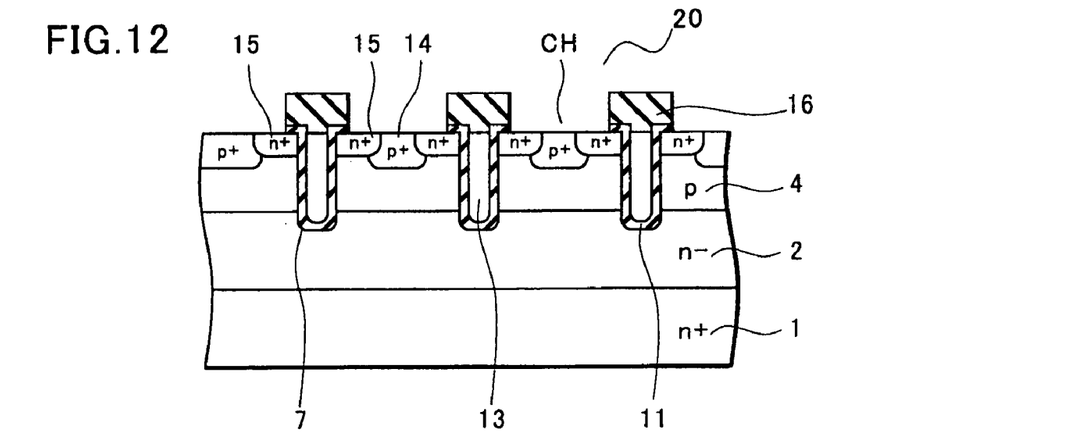
FIG. 12 is a sectional view for explaining a manufacturing method of a semiconductor device of the invention.
Figure 13:
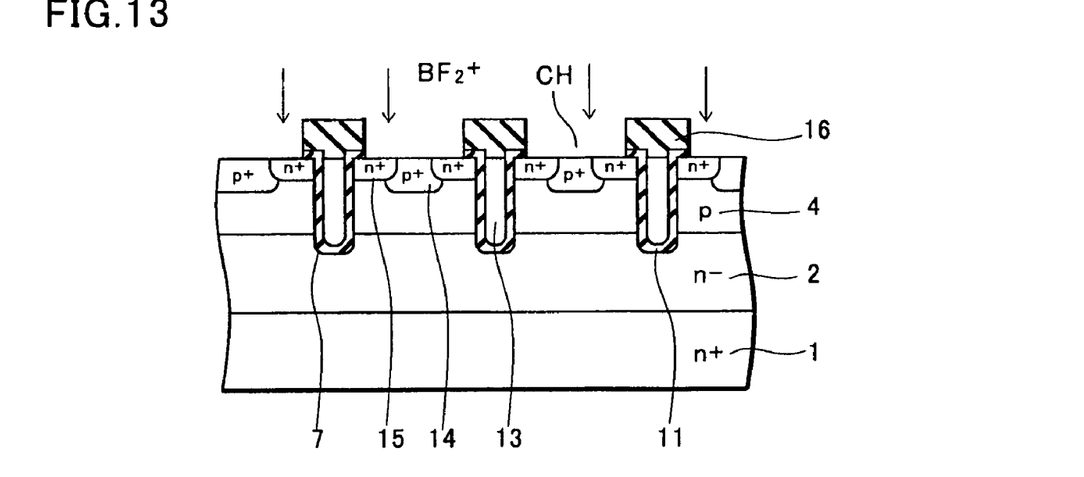
FIG. 13 is a sectional view for explaining the manufacturing method of the semiconductor device of the invention.
Figure 14:
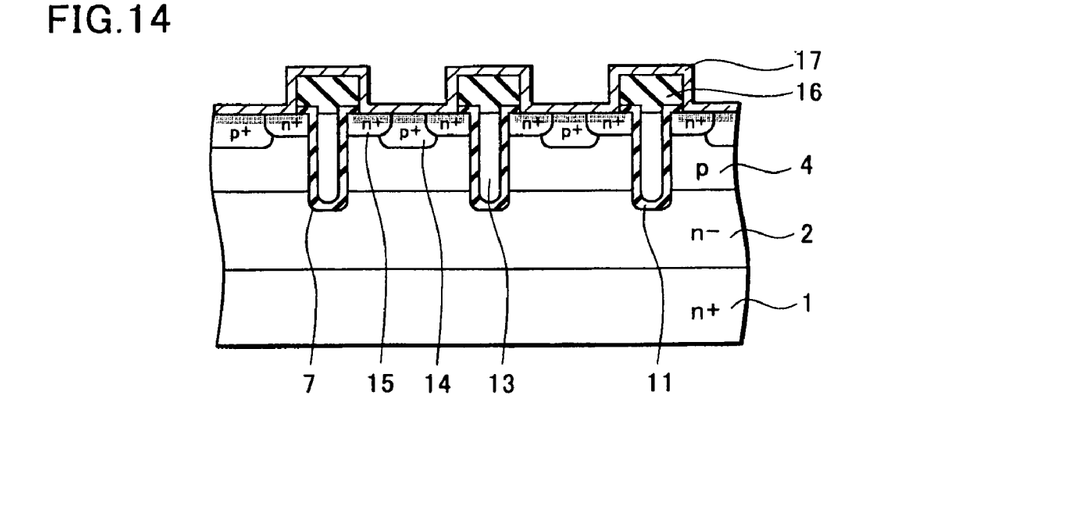
FIG. 14 is a sectional view for explaining the manufacturing method of the semiconductor device of the invention.

Next, as a second embodiment of the invention, a case of an n-channel MOSFET will be described with reference to FIGS. 12 to 14. Incidentally, a first step is the same as that of the first embodiment except that the conductivity is inverted, and its detailed description will be omitted.

First step (see FIG. 12): a drain region 2 made of an n$^-$-type epitaxial layer is formed on an n$^+$-type silicon semiconductor substrate 1, and a p-type channel layer 4 is provided on its surface. Trenches 7 are formed to pass through the channel 4 and to reach the drain region 2, an inner wall of each of the trenches 7 is coated with a gate oxide film 11, and a gate electrode 13 made of polysilicon filled in the trench 7 is provided.

Thereafter, body regions 14 and source regions 15 are formed. That is, masking is performed by a resist film to expose the planned body regions, and p-type impurities are selectively ion-implanted at an implantation energy of 50 KeV and a dosage of about $5 \times 10^{15}$ cm$^{-2}$. Thereafter, the resist film is removed.

Further, masking is performed by a new resist film to expose the planned source regions and the gate electrodes 13, and n-type impurities are ion-implanted at a dosage of $1 \times 10^{15}$ cm$^{-2}$ and an implantation energy of 50 about KeV.

Thereafter, an insulating film of BPSG (Boron Phosphorus Silicate Glass) or the like and a multilayer film which become an interlayer insulating film are deposited on the whole surface by a CVD method. The n-type impurities and the p-type impurities are diffused by a heat treatment (1000° C. or less, about 60 minutes) at the time of the film formation to form the n$^+$-type source regions 15 on the surface of the channel layer 4 adjacent to the trench 7 and the p$^+$-type body region 14 positioned between the source regions 15. By this, an element region 20 is formed.

In this embodiment, although the n-type impurities are implanted after the p-type impurities are implanted, the p-type impurities may by implanted after the n-type impurities are implanted.

Thereafter, an interlayer insulating film 16 is etched while a resist film is used as a mask, so that the interlayer insulating film 16 is made to remain-on at least the gate electrode 13, and a contact hole CH in which the source region 15 and the body region 14 are exposed is formed. The source region 15 and the body region 14 are connected to a metal wiring layer formed at a later step through the contact hole CH.

Second step (see FIG. 13): a step of implanting p-type impurities into the contact hole to the metal wiring layer in the element region.

Boron fluoride is ion-implanted into the whole surface without providing a mask. Since the interlayer insulating film 16 is formed on the gate electrode 13, boron fluoride is ion-implanted actually into the surfaces of the source region 15 and the body region 14.

At this time, the dosage of boron fluoride is made about 10% of the boron concentration at the time of the formation of the body region 14. Specifically, the dosage is preferably $4 \times 10^{14}$ cm$^{-2}$ to $1 \times 10^{15}$ cm$^{-2}$, and in this embodiment, the dosage of about $7 \times 10^{14}$ cm$^{-2}$ is adopted.

With respect to the implantation depth of boron fluoride, the ion implantation is performed under such a condition that the peak of the concentration profile of boron is positioned in a shallow region within 1000 Å from the surface of the substrate 1 (for example, about 300 Å from the substrate surface). Specifically, the implantation energy is made about 40 KeV. Incidentally, instead of boron fluoride, boron may be ion-implanted at an implantation energy of about 10 KeV.

Thereafter, the reflow after the formation of the contact hole CH is performed by a heat treatment at 1000° C. or lower for 30 minutes. Besides, the additionally implanted boron is diffused by this reflow.

On the other hand, since a mask is not provided, boron fluoride is ion-implanted also into the surface of the source region 15. However, in the source region 15, since the implantation amount is as high as about $1 \times 10^{15}$ cm$^{-2}$, the ion-implanted boron has little influence. Further, even if the total n-type impurity concentration is slightly lowered by the implantation of boron, since the contact resistance of the n-type region has such a characteristic that the contact resistance becomes low in a case where the n-type region is in contact with a titanium-based metal layer as compared with a case where it is in contact with aluminum, there is no problem.

Third step (see FIG. 14): a step of forming a high melting point metal layer which is in contact with at least the source region and the body region through the contact hole.

The silicon substrate is exposed in portions except the interlayer insulating film 16, and when aluminum alloy which becomes a metal wiring layer 18 is sputtered, there is a case where grains (silicon nodules) of silicon contained in aluminum alloy block up the body region 14 or the source region 15 which are minute regions. In order to suppress the silicon nodules and to prevent mutual diffusion, called spike, between the metal and the silicon substrate, a barrier metal layer made of titanium-based material is formed before the formation of the metal wiring layer 18.

Titanium is sputtered onto the whole surface to form a lamination film 17 of titanium and titanium nitride having a thickness of about 500 Å to 1000 Å. The high melting point metal layer 17 is in contact with the source region 15 and the body region 14 exposed in the contact hole CH. Thereafter, the high melting point metal layer 17 is subjected to a heat treatment at 400° C. to 500° C. to form a titanium silicide film.

As stated above, in this embodiment, the additionally implanted boron is diffused by the reflow after the formation of the contact hole CH, and the high melting point metal layer 17 is subsequently formed. That is, as compared with the case shown in FIG. 18 in which the reflow of the contact hole CH is performed after the diffusion of the additionally implanted boron, the amount of the heat treatment of the additionally implanted boron after the diffusion becomes small.

By this, since the impurity concentration of the surface of the body region 14 is kept at a high concentration, even if boron is absorbed by the titanium silicide film which is in contact with the body region 14, the specified surface concentration of the body region 14 can be kept.

In this embodiment, the body region 14 is formed to have a specified depth at the former step, and the additionally implanted boron has only to be activated in the vicinity of the surface of the body region 14 to contribute to the improvement of the impurity concentration.

Incidentally, even if the body region 14 is formed to be deep, differently from the case of the p-channel type, there is no deterioration due to the short channel effect. However, when the additionally implanted born is diffused deeply, the surface of the body region 14 can not keep the high impurity concentration after all, the impurity concentration of the surface is lowered due to the absorption by titanium silicide, and the contact resistance is increased.

However, according to this embodiment, the impurity concentration of the surface of the body region 14 is kept at a high concentration. Even if boron is absorbed by the titanium silicide film, the specified surface concentration of the body region can be kept, and the deterioration of avalanche resistance can be prevented.

Fourth step (see FIG. 6): the metal wiring layer is formed on the high melting point metal layer. Since this step is also similar to that of the first embodiment, its description will be omitted.

Incidentally, the formation condition of the body region and the ion implantation condition of the additional boron implantation in the second embodiment are the same as those of the first embodiment. Accordingly, the concentration profile simulation of this embodiment and the dependency of the contact resistance and the additional implantation amount are the same as those of FIGS. 7, 8, 11A and 11B.

Besides, as described above, in the embodiment, although the description has been given to the example of the MOSFET, the invention is not limited to this, and can also be carried out similarly for a semiconductor device having a contact hole in which an impurity region including boron is in contact with titanium.

What is claimed is:

1. A manufacturing method of a semiconductor device, comprising:
providing a semiconductor substrate;
performing a first ion implantation into the substrate to form a p-type impurity diffusion region;
performing a second ion implantation into the substrate to form an n-type impurity diffusion region;
forming an interlayer insulating film on the p-type impurity diffusion region and the n-type impurity diffusion region after the first and second ion implantations;
forming a contact hole in the interlayer insulating film to expose at least part of n-type impurity diffusion region and part of the p-type impurity diffusion region;
performing a third ion implantation into the exposed p-type impurity diffusion region and the exposed n-type impurity diffusion region through the contact hole of the interlayer insulating film, the third ion implantation being of a p-type impurity; and
depositing a high melting point metal layer on the interlayer insulating film so that the high melting point metal layer is connected with at least the p-type impurity diffusion region through the contact hole of the interlayer insulating film.

2. A manufacturing method of a semiconductor device, comprising:
forming a drain region, a gate electrode, a source region and a body region on a semiconductor substrate;
forming on the substrate an interlayer insulating film having a contact hole to expose at least part of the body region and part of the source region;
implanting a p-type impurity into the exposed source region and the exposed body region through the contact hole; and
depositing a high melting point metal layer on the interlayer insulating film so that the high melting point metal layer is connected with at least the source region through the contact hole of the interlayer insulating film.

3. A manufacturing method of a semiconductor device according to claim 1 or 2, wherein the high melting point metal layer comprises titanium.

4. A manufacturing method of a semiconductor device according to claim 2, wherein the p-type impurity comprises boron.

5. A manufacturing method of a semiconductor device according to claim 2, wherein the p-type impurity is implanted at a dosage of about 1/10 of an impurity dosage required to form the source region.

6. A manufacturing method of a semiconductor device according to claim 2, wherein the p-type impurity is implanted at a dosage of about 1/10 of an impurity dosage required to form the body region.

7. A manufacturing method of a semiconductor device according to claim 2, wherein the p-type impurity is ion-implanted and a peak of a concentration profile of the p-type impurity is positioned within about 1000 Å from a surface of the element region.

8. A manufacturing method of a semiconductor device according to claim 4, wherein the p-type impurity is implanted at a dosage of about $4\times10^{14}$ cm$^{-2}$ to $1\times10^{15}$ cm$^{-2}$.

* * * * *